(12) United States Patent
Bailey et al.

(10) Patent No.: US 7,148,744 B2
(45) Date of Patent: Dec. 12, 2006

(54) CALIBRATION TECHNIQUE FOR VARIABLE-GAIN AMPLIFIERS

(75) Inventors: James A. Bailey, Snowflake, AZ (US); Stephen J. Franck, Felton, CA (US)

(73) Assignee: Agere Systems Inc., Allentown, PA (US)

( * ) Notice: Subject to any disclaimer, the term of this patent is extended or adjusted under 35 U.S.C. 154(b) by 87 days.

(21) Appl. No.: 10/862,699

(22) Filed: Jun. 7, 2004

(65) Prior Publication Data

US 2005/0270092 A1  Dec. 8, 2005

(51) Int. Cl.
*H03F 1/02* (2006.01)
*H03L 5/00* (2006.01)

(52) U.S. Cl. .......................... 330/9; 327/307
(58) Field of Classification Search ................ None
See application file for complete search history.

(56) References Cited

U.S. PATENT DOCUMENTS

| | | | |
|---|---|---|---|
| 5,194,822 A | 3/1993 | Bureau et al. | 330/129 |
| 6,141,169 A | 10/2000 | Pietruszynski et al. | 360/67 |
| 6,441,684 B1 * | 8/2002 | Nakamura | 330/9 |
| 6,684,065 B1 | 1/2004 | Bult et al. | 455/252.1 |
| 6,711,391 B1 | 3/2004 | Walker et al. | 455/234.1 |
| 6,753,727 B1 * | 6/2004 | Magoon et al. | 330/9 |
| 6,756,924 B1 * | 6/2004 | Lee et al. | 341/120 |
| 2005/0184801 A1 * | 8/2005 | Gai et al. | 330/9 |

OTHER PUBLICATIONS

SA 21.3: "A High-Performance Autozeroed CMOS Opamp with ToμV Offset", Francois Krummenacher et al., 1997 IEEE International Solid-State Circuits Conference, pp. 350-351.
Applicant's admitted prior-art technique for reducing offset in high-frequency amplifiers.

* cited by examiner

*Primary Examiner*—Robert Pascal
*Assistant Examiner*—Krista M. Flanagan

(57) ABSTRACT

A variable-gain amplifier (VGA), with one or more amplifier stages, has two or more offset correction sources connected to apply offset correction signals at different locations in the VGA. In one embodiment, each amplifier stage has both an input offset correction source and an output offset correction source. In another embodiment, each amplifier stage of a multi-stage VGA has an input offset correction source. By sequentially calibrating each amplifier stage, starting with the initial stage and proceeding downstream, the entire VGA can be calibrated to achieve gain-independent compensation for the adverse affects of input and output voltage offsets at the input and output, respectively, of each stage.

24 Claims, 3 Drawing Sheets

CALIBRATION TECHNIQUE FOR VARIABLE-GAIN AMPLIFIERS

BACKGROUND OF THE INVENTION

1. Field of the Invention

The present invention relates to electrical circuits, and, in particular, to variable-gain amplifiers.

2. Description of the Related Art

Variable-gain amplifiers (VGAs) are often implemented using multiple amplifier stages connected in series, where each successive amplifier stage further amplifies the output from the previous amplifier stage. As indicated by its name, a VGA can be operated over a range of different gain settings, where each amplifier stage contributes, e.g., proportionately, to the overall amplifier gain.

In such a multi-stage VGA, deviations from ideal operations can result from voltage offsets that can occur at both the input and the output of each amplifier stage, where the input and output offset levels can be independent from each other and also independent from the offsets at different stages. These offsets can result from process variations during fabrication/manufacturing as well as from changes in operating conditions such as age, temperature, humidity, and the like.

One conventional technique for compensating multi-stage VGAs for these input and output offsets relies on AC-coupling and zero-forcing during squelch intervals. One disadvantage of this technique is that a relatively long squelch interval (e.g., about 50–100 nanosec) is typically required, during which time the amplifier is not available for signal processing of user data. As a result, analog storage of the offset compensation is required. Moreover, zero-forcing involves the use of a high-gain, low-offset, high-speed auxiliary amplifier, which typically increases the cost, size, and complexity of the VGA.

SUMMARY OF THE INVENTION

Problems in the prior art are addressed in accordance with the principles of the present invention by a technique for calibrating a variable-gain amplifier that does not suffer from all of the disadvantages of conventional techniques that rely on AC-coupling and zero-forcing. According to certain embodiments, the present invention is circuitry having a VGA comprising one or more amplifier stages and two or more offset correction sources connected to apply two or more offset correction signals at two or more different locations within the VGA. According to other embodiments, the present invention is a method for calibrating a VGA comprising one or more amplifier stages and two or more offset correction sources connected to apply two or more offset correction signals at two or more different locations within the VGA, the method comprising controlling the two or more offset correction sources to achieve desired corresponding amplifier stage output signals.

The offset correction achieved using such techniques can be independent of the VGA's gain setting. Moreover, no additional poles need to be added to the signal path, and the offset correction results can be stored in digital storage elements, thereby eliminating the need for sample/hold or similar analog memory elements that require periodic refreshing and which are typically used in conventional VGA calibration techniques.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

VGAs Having Input and Output Offset Correction Sources

Figure 1:
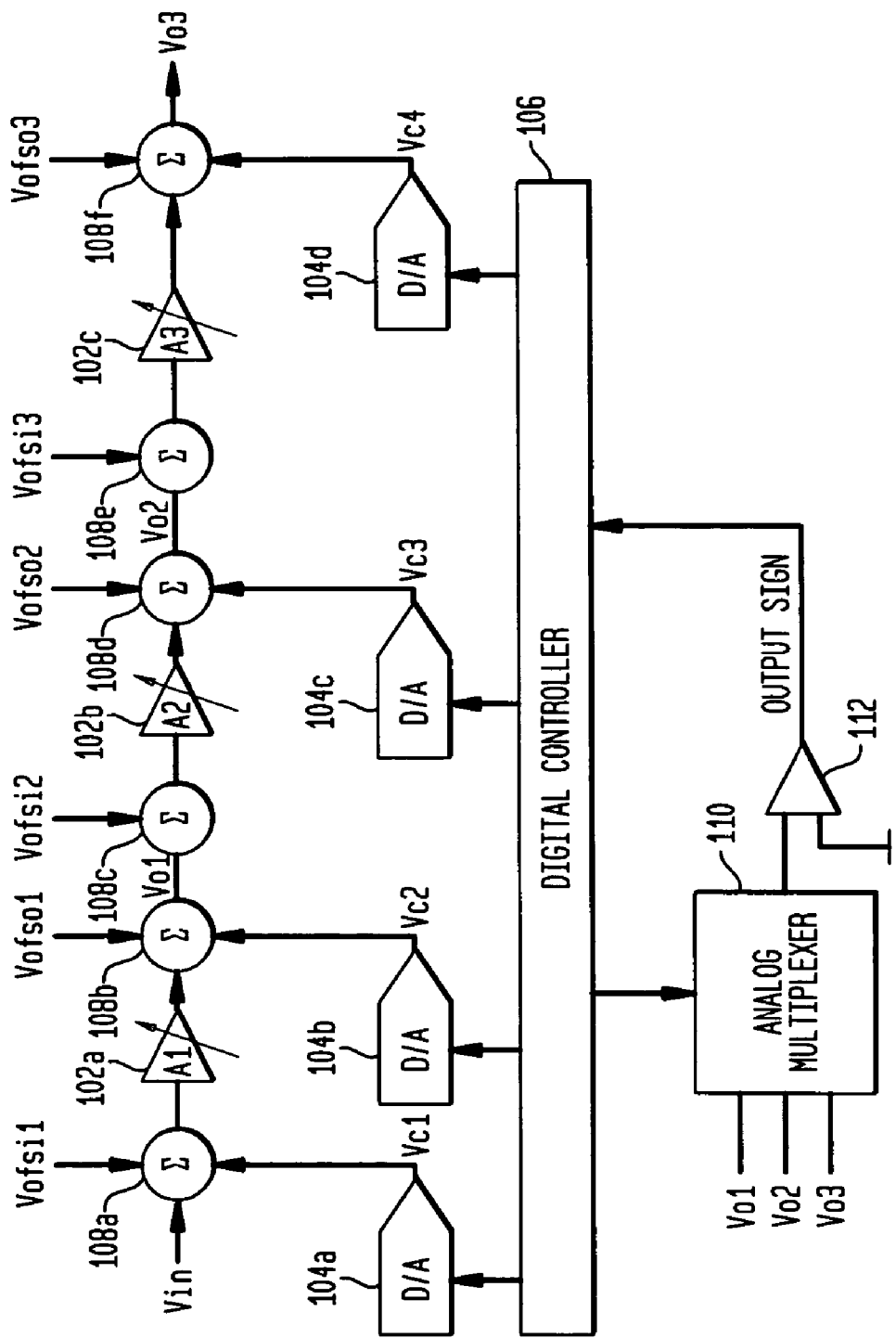
FIG. 1 shows a schematic diagram of a three-stage variable-gain amplifier, according to one embodiment of the present invention.

FIG. 1 shows a schematic diagram of a three-stage variable-gain amplifier 100, according to one embodiment of the present invention. As shown in FIG. 1, VGA 100 has three amplifier stages 102a–c and four offset correction sources, represented by four digital-to-analog (D/A) converters 104a–d operating under the control of digital controller 106.

Ignoring the offset correction voltages Vc1–Vc4 applied by D/A converters 104a–d for the time being, under ideal conditions, an input signal Vin is input to and amplified by initial amplifier stage 102a to generate output signal Vo1, which is then input to second amplifier stage 102b, which generates output signal Vo2, which is then input to third and final amplifier stage 102c, which generates output signal Vo3, which is also the output signal for VGA 100.

Unfortunately, due to process variations and/or changes in operating conditions, an offset voltage that occurs in an amplifier stage can be treated as if it were either an offset voltage appearing at the input of the amplifier stage or an offset voltage appearing at the output of the amplifier stage. These are represented in FIG. 1 by offset voltages injected at summation nodes 108a–f. For example, at summation node 108a, an input offset voltage Vofsi1 is shown being injected at the input of initial amplifier stage 102a at summation node 108a, while an output offset voltage Vofso1 is shown being injected at the output of initial amplifier stage 102a at summation node 108b. Similarly, input and output offset voltages Vofsi2 and Vofso2 are shown being injected into the input and output of second amplifier stage 102b at summation nodes 108c and 108d, respectively, and input and output offset voltages Vofsi3 and Vofso3 are shown being injected into the input and output of third amplifier stage 102c at summation nodes 108e and 108f, respectively. These offset voltages, which are amplified (with the exception of Vofso3) by the downstream amplifier stages, contribute undesirable noise to the VGA output signal Vo3, which can lead to bit errors or other undesirable data processing artifacts downstream of VGA 100. In addition, offset voltages can limit the dynamic range of the amplifier and produce an undesirable, gain-dependent signal component. Note that summation nodes 108c and 108e represent the injection of input offset voltages at stages 102b and 102c, respectively. As such, those summation nodes should not necessarily be interpreted as representing actual elements in the amplifier architecture. On the other hand, offset correction voltages from D/A converters 104a–d may be considered to be applied at actual summation nodes (i.e., nodes 108a, 108b, 108d, and 108f) in the amplifier architecture.

As shown in FIG. 1, to compensate for these various input and output offset voltages, offset correction voltages Vc1–Vc4 are applied into the amplifier signal path at summation nodes 108a, 108b, 108d, and 108f, respectively. Ideally, offset correction voltages Vc1–Vc4 are selected to compensate exactly for the effects of the six offset voltages Vofsi1–Vofsi3 and Vofso1–Vofso3, such that output signal Vo3 corresponds only to an amplified version of input signal Vin, independent of the VGA's gain setting. In reality, offset correction voltages Vc1–Vc4 are selected at least to reduce and hopefully minimize the net effect of the various offset voltages in a manner that is substantially independent of the gain setting of the VGA.

Figure 2:
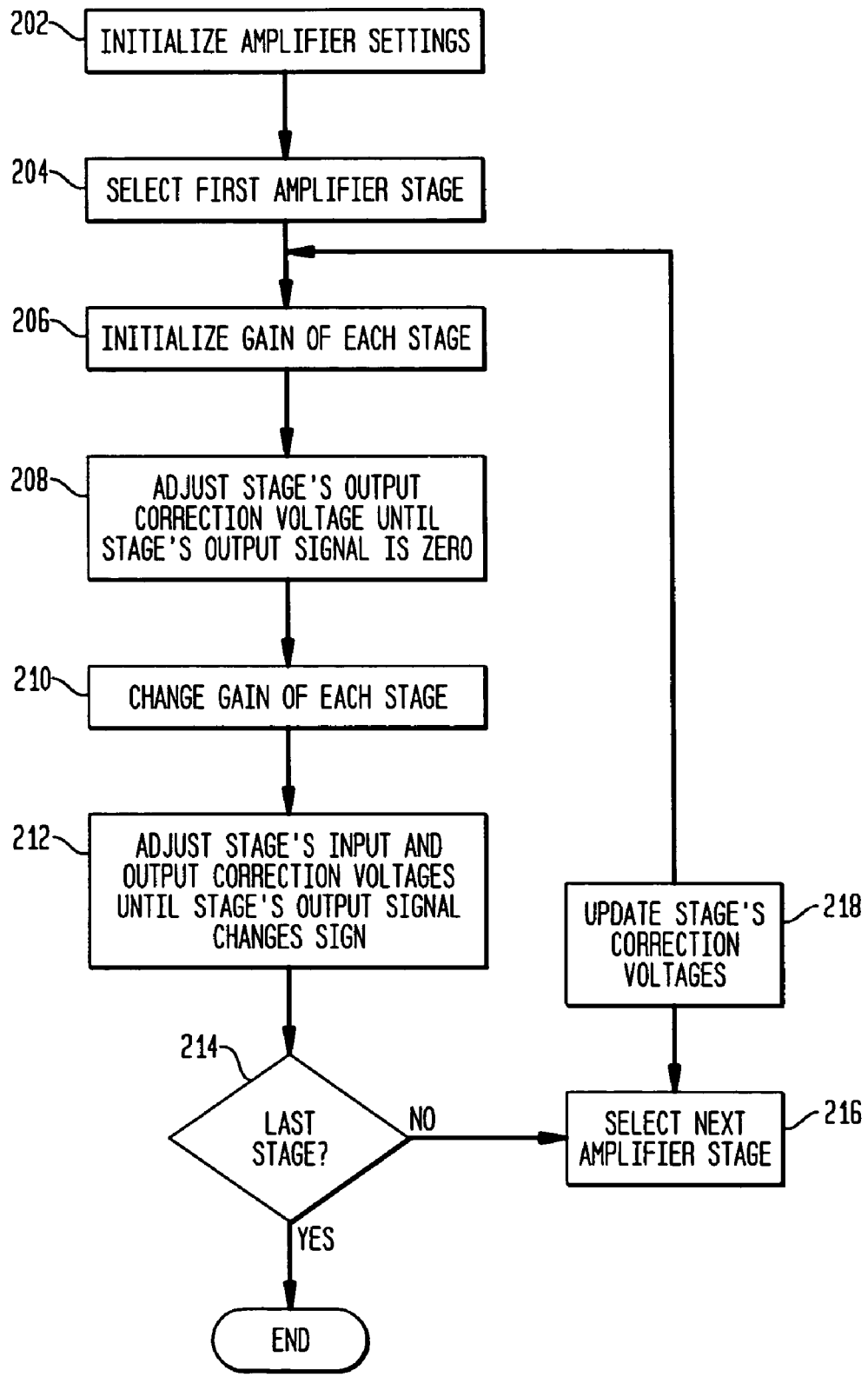
FIG. 2 shows a flow diagram representing a method for calibrating VGAs, such as the VGA of FIG. 1, according to one embodiment of the present invention.

FIG. 2 shows a flow diagram representing a method for calibrating VGAs, such as VGA 100 of FIG. 1, according to one embodiment of the present invention. At step 202, the amplifier settings are initialized. In one implementation, this involves setting Vin and all of the offset correction voltages Vc1–Vc4 to 0V. Steps 204, 214, and 216 sequentially select different amplifier stages, one at a time starting with the initial amplifier stage and proceeding downstream to the final amplifier stage. The following processing steps are described in the context of initial amplifier stage 102a of VGA 100 of FIG. 1 being the currently selected amplifier stage. Those same processing steps are analogously applied when each other amplifier stage is subsequently selected.

At step 206, the gains of the amplifier stages are initialized, e.g., to unity. For this particular embodiment, all that is needed is that the gains of the currently selected amplifier stage and any preceding amplifier stages be initialized. In some VGA designs, however, the amplifier stages might be controlled together, in which case, all of the gains would be initialized together. Either way, the implementation of this particular embodiment of the present invention should not be affected.

At step 208, the output signal Vo1 of initial amplifier stage 102a is measured, and offset correction signal Vc2 is adjusted (i.e., up or down as appropriate) until Vo1=0V. With Vin and Vc1 both initialized to 0V and amplifier stage 102a set at unity gain, Equation (1) applies as follows:

$$Vo1 = Vofsi1 + Vofso1 + Vc2. \quad (1)$$

After adjusting Vc2 in step 208 such that Vo1=0V, Equation (2) applies as follows:

$$Vc2 = -Vofso1 - Vofsi1. \quad (2)$$

At step 210, the gains of the amplifier stages are changed, e.g., to 2. Here, too, for this particular embodiment, all that is needed is that the gains of the currently selected amplifier stage and any preceding amplifier stages be changed. Changing the gains of the amplifier stages will typically result in changes to the output signals of the amplifier stages (e.g., output signal Vo1 of amplifier stage 102a).

At step 212, output signal Vo1 of initial amplifier stage 102a is measured, and offset correction signals Vc1 and Vc2 are adjusted until the sign of Vo1 just changes. For example, if, after changing the gains of the amplifier stages, Vo1>0V, then Vc1 and Vc2 are incrementally adjusted according to Equations (3) and (4) as follows:

$$Vc1 = Vc1 - \Delta v \quad (3)$$

$$Vc2 = Vc1 + \Delta v, \quad (4)$$

where $\Delta v$ is an appropriate, selected voltage increment (e.g., 0.5 mV). Otherwise, if, after changing the gains of the amplifier stages, Vo1<0V, then Vc1 and Vc2 are incrementally adjusted according to Equations (5) and (6) as follows:

$$Vc1 = Vc1 + \Delta v \quad (5)$$

$$Vc2 = Vc1 - \Delta v. \quad (6)$$

The incremental adjustments of Equations (3) and (4) or of Equations (5) and (6) are continued until the sign of Vo1 just changes.

With Vin=0V and the gain amplifier stage 102a set at 2, Equation (7) applies as follows:

$$Vo1 = 2*(Vofsi1 + Vc1) + Vofso1 + Vc2. \quad (7)$$

Just before the incremental adjustments of step 212, Vc1=0V (from the earlier amplifier initialization) and Vc2 is given by Equation (2). Substituting these equations into Equation (7) yields Equation (8) as follows:

$$Vo1 = Vofsi1. \quad (8)$$

Using the incremental adjustments of Equations (3)–(4) or Equations (5)–(6) ensures that the relationship between the overall (i.e., accumulated) change $\Delta Vc1$ to offset correction voltage Vc1 and the overall change $\Delta Vc2$ to offset correction voltage Vc2 is given by Equation (9) as follows:

$$\Delta Vc2 = -Vc1. \quad (9)$$

Based on Vc1 having been initialized to 0V and Equation (2) resulting from step 208, the overall changes to Vc1 and Vc2 result in Equations (10) and (11) as follows:

$$Vc1 = \Delta Vc1 \quad (10)$$

and $$Vc2 = -Vofso1 - Vofsi1 - \Delta Vc1. \quad (11)$$

Substituting Equations (10) and (11) into Equation (7) yields Equation (12) as follows:

$$Vo1 = 2*(Vofsi1 + \Delta Vc1) + Vofso1 - Vofso1 - Vofsi1 - \Delta Vc1, \quad (12)$$

which reduces to Equation (13) as follows:

$$Vo1 = Vofsi1 + \Delta Vc1. \quad (13)$$

At the point where Vo1 just changes sign (i.e., Vo1≈0), Equation (13) implies Equation (14) as follows:

$$\Delta Vc1 = -Vofsi1, \quad (14)$$

where Vc1=$\Delta$Vc1, since Vc1 was previously initialized to 0V. Substituting Equation (14) into Equation (11) yields Equation (15) as follows:

$$Vc2 = -Vofso1. \quad (15)$$

Thus, at the completion of step 212, offset correction Vc1 substantially—if not exactly—compensates for the input offset voltage Vofsi1 of amplifier stage 102a, and offset correction Vc2 substantially—if not exactly—compensates for the output offset voltage Vofso1 of amplifier stage 102a.

In the context of VGA 100 of FIG. 1, following the application of steps 206–212 for initial amplifier stage 102a, second amplifier stage 102b is selected at step 216, and the offset correction voltages for second amplifier stage 102b are updated at step 218 based on the calibration results from the previous amplifier stage (in this case, initial amplifier stage 102a). In particular, the input offset correction voltage for second amplifier stage 102b is kept at the value (i.e., Vc2) derived for the output offset correction voltage for initial amplifier stage 102a, while the output offset correction voltage for second amplifier stage 102b (i.e., Vc3) is set to −Vc2, which on average reduces the number of steps required to compensate the output offset voltage during the incremental adjustments of step 212.

After the processing of FIG. 2 has been completed for the final amplifier stage (e.g., amplifier stage 102c of FIG. 1), all of the offset correction sources will have been configured to compensate substantially—if not exactly—for all of the input and output offset voltages at the various stages of the VGA.

Those skilled in the art will appreciate that some or all of the settings previously described for the method of FIG. 2 may be changed for different implementations of the present invention. For example, the generalized compensation on the output offset correction source during adjustment of the input offset correction source is given by Equation (16) as follows:

$$\Delta Vci = \Delta Vc(i-1) * (G-1), \quad (16)$$

where G is the gain of the amplifier stage, where G>1. This relationship may be useful for VGAs whose amplifier stages cannot produce gains of 2 for steps 210 and 212.

Similarly, in theory, the method of FIG. 2 could be implemented for gain settings other than unity for steps 206 and 208, and the offset correction signals Vci and even the input voltage Vin do not necessarily have to be initialized to 0V, as long as their non-zero values are taken into account during the calibration processing.

Referring again to FIG. 1, VGA 100 has a single analog multiplexer (mux) 110 and a single differential comparator 112. As shown in FIG. 1, mux 110 receives samples of the outputs (Vo1–Vo3) from all three amplifier stages (which are tapped from the amplifier's signal path using elements—possibly including analog-to-digital converters—that are not shown in FIG. 1). Digital controller 106 controls mux 110 to output a selected amplifier stage output signal (i.e., one of Vo1–Vo3) for application to differential comparator 112, which compares the selected output signal to ground to determine whether the sign of the selected output signal is positive or negative, which information is fed back to digital controller 106 for use during the incremental adjustments of step 212 to determine when the sign of the selected output signal just changes. Because the preferred method of FIG. 2 calibrates each amplifier stage sequentially, VGA 100 can advantageously be implemented with a single differential comparator that is operationally multiplexed using mux 110 for use in calibrating all of the amplifier stages. Of course, such multiplexing is not required, and a different differential comparator could be implemented for each different amplifier stage output signal.

VGAs Having Input Offset Correction Sources

VGA 100 of FIG. 1 has an input offset correction source and an output offset correction source for each of its amplifier stages. In an alternative embodiment of the present invention, a VGA might have only input offset correction sources. This can be achieved by modifying VGA 100 to eliminate D/A converter 104d, summation node 108f, and their associated wiring. The resulting multi-stage VGA may be considered to have only input offset correction sources, one per stage.

Figure 3:
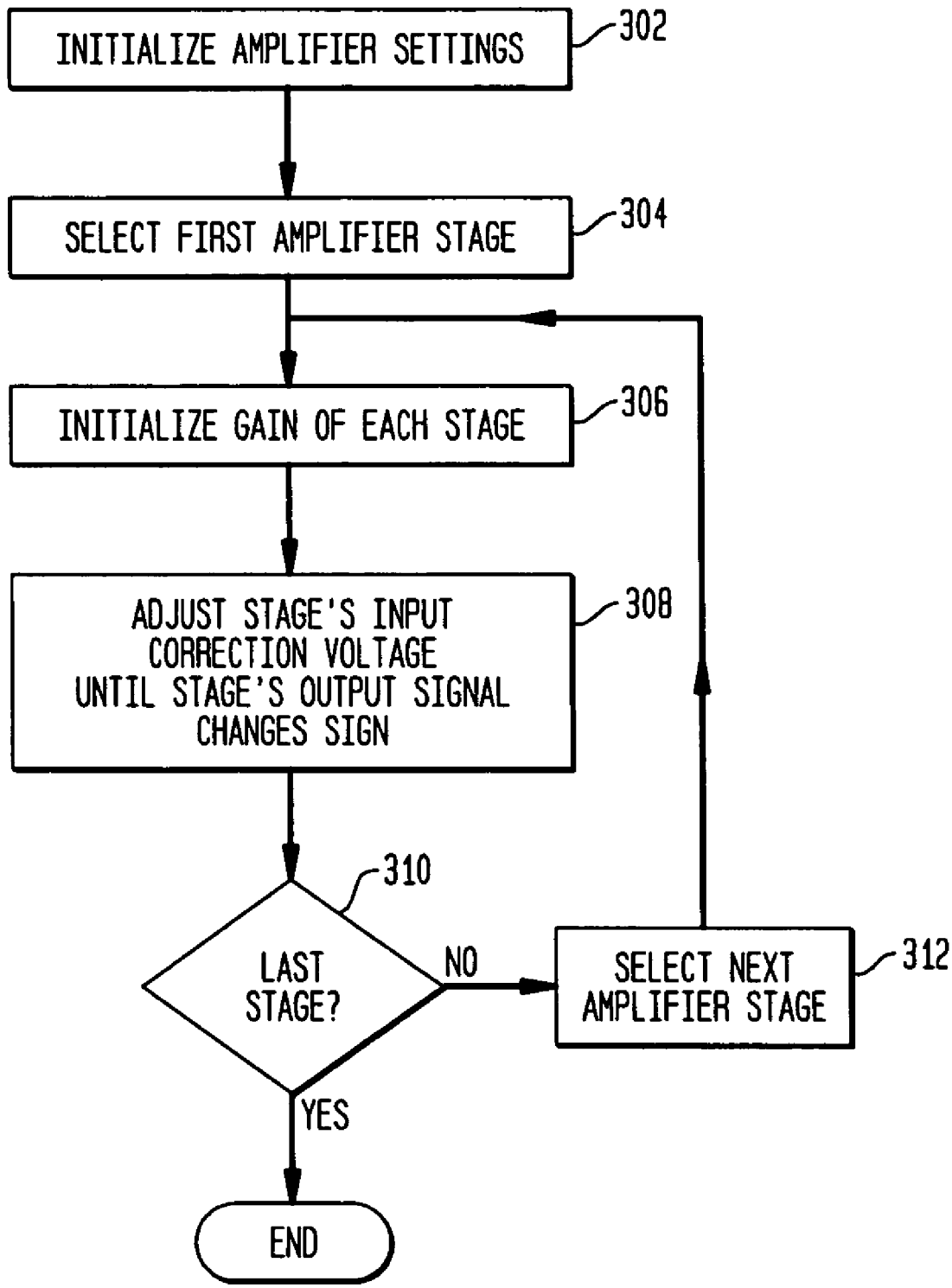
FIG. 3 shows a flow diagram representing a method for calibrating VGAs, such as a modified version of the VGA of FIG. 1, according to another embodiment of the present invention.

FIG. 3 shows a flow diagram representing a method for calibrating such a modified VGA, according to another embodiment of the present invention. The method of FIG. 3 is similar to the method of FIG. 2 without steps 208 and 210. In particular, at step 302, the amplifier settings are initialized. In one implementation, this involves setting Vin and all of the offset correction voltages Vc1–Vc3 to 0V. Steps 304, 310, and 312 sequentially select different amplifier stages, one at a time starting with the initial amplifier stage and proceeding downstream to the final amplifier stage. The following processing steps are described in the context of initial amplifier stage 102a of VGA 100 of FIG. 1 being the currently selected amplifier stage. Those same processing steps are analogously applied when each other amplifier stage is subsequently selected.

At step 306, the gains of the amplifier stages are initialized, e.g., to a high-gain setting, such as 2. At step 308, output signal Vo1 of initial amplifier stage 102a is measured, and offset correction signal Vc1 is adjusted until the sign of Vo1 just changes. At the completion of step 308, offset correction Vc1 substantially—if not exactly—compensates for both the input offset voltage Vofsi1 and the output offset voltage Vofso1 of amplifier stage 102a.

In the context of the modified version of VGA 100 of FIG. 1, following the application of steps 306–308 for initial amplifier stage 102a, second amplifier stage 102b is selected at step 312 and processing returns to step 306 to calibrate the second amplifier stage. After the processing of FIG. 3 has been completed for the final amplifier stage (e.g., amplifier stage 102c of FIG. 1), all of the input offset correction sources will have been configured to compensate substantially—if not exactly—for all of the input and output offset voltages at the various stages of the VGA.

Although the present invention has been described in the context of a three-stage VGA, in general, the present invention can be implemented for any VGA having one or more amplifier stages. Moreover, although the present invention has been described in the context of multi-stage VGAs in which one or two voltage correction signals are applied at each amplifier stage, in theory, the invention can be implemented for a multi-stage VGA in which one or more of the amplifier stages do not receive any voltage correction signals.

Digital controller 106 can be implemented using any suitable circuitry, including possible implementation as a single integrated circuit (such as an ASIC or an FPGA), a multi-chip module, a single card, or a multi-card circuit pack. For example, the digital controller can be implemented as a relatively small macro in an integrated circuit that also implements the rest of VGA 100. As would be apparent to one skilled in the art, various functions of circuit elements may also be implemented as processing steps in a software program. Such software may be employed in, for example, a digital signal processor, micro-controller, or general-purpose computer.

The present invention can be embodied in the form of methods and apparatuses for practicing those methods. The present invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The present invention can also be embodied in the form of program code, for example, whether stored in a storage medium, loaded into and/or executed by a machine, or transmitted over some transmission medium or carrier, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

Although the steps in the following method claims, if any, are recited in a particular sequence with corresponding labeling, unless the claim recitations otherwise imply a particular sequence for implementing some or all of those steps, those steps are not necessarily intended to be limited to being implemented in that particular sequence.

We claim:

1. Circuitry having a variable-gain amplifier (VGA), the VGA comprising:
   one or more amplifier stages; and
   two or more offset correction sources connected to apply two or more offset correction signals at two or more different locations within the VGA, wherein each amplifier stage has:
      an input offset correction source connected to apply an input offset correction signal at an input of the amplifier stage; and
      an output offset correction source connected to apply an output offset correction signal at an output of the amplifier stage.

2. The invention of claim 1, wherein:
   each offset correction signal is an analog voltage signal; and
   each offset correction source comprises:
      a digital storage element; and
      a digital-to-analog converter (DAC) adapted to convert a digital value stored in the digital storage element into an analog voltage for the corresponding offset correction signal.

3. The invention of claim 2, further comprising a controller adapted to control the digital values stored in the digital storage elements.

4. The invention of claim 1, wherein the VGA has two or more series-connected amplifier stages comprising an initial amplifier stage and one or more subsequent amplifier stages.

5. The invention of claim 4, wherein an input offset correction source for each amplifier stage other than the initial amplifier stage also functions as an output offset correction source for the immediately preceding amplifier stage.

6. The invention of claim 4, further comprising:
   a controller adapted to control each offset correction source;
   a multiplexer connected to receive a sample of the output of each amplifier stage and adapted to select one of the samples as directed by the controller; and
   a comparator connected to receive the selected sample from the multiplexer and adapted to generate a corresponding comparator output signal based on a comparison of the selected sample to a reference signal, wherein:
      the controller is adapted to control each offset correction source based on the corresponding comparator output signal.

7. The invention of claim 6, wherein, for one or more of the offset correction sources, the controller is adapted to adjust the offset correction source until the sign of the corresponding comparator output signal changes.

8. The invention of claim 6, wherein the controller is adapted to adjust the offset correction sources for the amplifier stages sequentially starting with the initial amplifier stage and proceeding downstream.

9. The invention of claim 1, wherein the VGA is implemented in integrated circuitry.

10. A method for calibrating a VGA comprising one or more amplifier stages and two or more offset correction sources connected to apply two or more offset correction signals at two or more different locations within the VGA, the method comprising controlling the two or more offset correction sources to achieve desired corresponding amplifier stage output signals, wherein each amplifier stage has:
    an input offset correction source connected to apply an input offset correction signal at an input of the amplifier stage; and
    an output offset correction source connected to apply an output offset correction signal at an output of the amplifier stage.

11. The invention of claim 10, wherein:
    the VGA has two or more amplifier stages connected in series; and
    sequentially, staffing with an initial amplifier stage and proceeding downstream, controlling a corresponding input offset correction source until the sign of a corresponding amplifier stage output signal changes.

12. The invention of claim 10, wherein:
    with at least one amplifier stage set to a first gain setting, a corresponding output offset correction signal is set to achieve a first desired amplifier output signal; and
    with the at least one amplifier stage set to a second gain setting, the corresponding input and output offset correction signals are adjusted to achieve a second desired amplifier output signal.

13. The invention of claim 12, wherein:
    the first gain setting corresponds to unity gain;
    the first desired amplifier output signal is substantially zero when an input signal to the VGA and the input offset correction signal are both zero; and
    the second desired amplifier output signal is achieved by adjusting the input and output offset correction signals until the sign of the amplifier output signal changes.

14. The invention of claim 13, wherein the second gain setting is a gain of two.

15. The invention of claim 13, wherein the input and output offset correction signals are adjusted in opposite directions in increments of equivalent magnitude until the sign of the amplifier output signal changes.

16. The invention of claim 10, wherein:
    the VGA has two or more amplifier stages comprising an initial amplifier stage and one or more subsequent amplifier stages; and
    the input and output offset correction sources for each amplifier stage are sequentially adjusted starting with the initial amplifier stage and proceeding downstream.

17. The invention of claim 16, wherein the input and output offset correction signals for each subsequent amplifier stage are initialized based on the input and output offset correction signals for a corresponding preceding amplifier stage.

18. Circuitry having a VGA comprising:

two or more series-connected amplifier stages comprising an initial amplifier stage and one or more subsequent amplifier stages;

two or more offset correction sources connected to apply two or more offset correction signals at two or more different locations within the VGA;

a controller adapted to control each offset correction source;

a multiplexer connected to receive a sample of the output of each amplifier stage and adapted to select one of the samples as directed by the controller; and a comparator connected to receive the selected sample from the multiplexer and adapted to generate a comparator output signal based on a comparison of the selected sample to a reference signal, wherein:

the controller is adapted to control each offset correction source based on the corresponding comparator output signal.

19. The invention of claim 18, wherein, for one or more of the offset correction sources, the controller is adapted to adjust the offset correction source until the sign of the corresponding comparator output signal changes.

20. The invention of claim 18, wherein the controller is adapted to adjust the offset correction sources for the amplifier stages sequentially starting with the initial amplifier stage and proceeding downstream.

21. A method for calibrating a VGA comprising one or more amplifier stages and two or more offset correction sources connected to apply two or more offset correction signals at two or more different locations within the VGA, the method comprising controlling the two or more offset correction sources to achieve desired corresponding amplifier stage output signals, wherein:

at least one amplifier stage has:

an input offset correction source connected to apply an input offset correction signal at an input of the amplifier stage;

an output offset correction source connected to apply an output offset correction signal at an output of the amplifier stage;

with the at least one amplifier stage set to a first gain setting, the output offset correction signal is set to achieve a first desired amplifier output signal;

with the at least one amplifier stage set to a second gain setting, the input and output offset correction signals are adjusted to achieve a second desired amplifier output signal;

the first gain setting corresponds to unity gain;

the first desired amplifier output signal is substantially zero when an input signal to the VGA and the input offset correction signal are both zero; and the second desired amplifier output signal is achieved by adjusting the input and output offset correction signals until the sign of the amplifier output signal changes.

22. The invention of claim 21, wherein the input and output offset correction signals are adjusted in opposite directions in increments of equivalent magnitude until the sign of the amplifier output signal changes.

23. A method for calibrating a VGA comprising (i) two or more amplifier stages comprising an initial amplifier stage and one or more subsequent amplifier stages and (ii) two or more offset correction sources connected to apply two or more offset correction signals at two or more different locations within the VGA, the method comprising controlling the two or more offset correction sources to achieve desired corresponding amplifier stage output signals, wherein:

each amplifier stage has an input offset correction source and an output offset correction source; and the input and output offset correction sources for each amplifier stage are sequentially adjusted starting with the initial amplifier stage and proceeding downstream.

24. The invention of claim 23, wherein the input and output offset correction signals for each subsequent amplifier stage are initialized based on the input and output offset correction signals for a corresponding preceding amplifier stage.

* * * * *